(12) United States Patent
Asano

(10) Patent No.: US 7,148,686 B2
(45) Date of Patent: Dec. 12, 2006

(54) SYSTEMS AND METHODS FOR GENERATING A PULSE SEQUENCE FOR MITIGATING A LIMITATION ON SPATIAL SELECTIVITY

(75) Inventor: Kenji Asano, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 12 days.

(21) Appl. No.: 10/926,696

(22) Filed: Aug. 26, 2004

(65) Prior Publication Data

US 2005/0057250 A1 Mar. 17, 2005

(30) Foreign Application Priority Data

Sep. 16, 2003 (JP) ............................. 2003-322918

(51) Int. Cl.
*G01V 3/00* (2006.01)
(52) U.S. Cl. ................................................... 324/309
(58) Field of Classification Search .................... None
See application file for complete search history.

(56) References Cited

U.S. PATENT DOCUMENTS

| | | | |
|---|---|---|---|
| 4,940,055 A | | 7/1990 | Brown |
| 4,983,918 A | * | 1/1991 | Nakabayashi ................ 324/309 |
| 5,051,699 A | * | 9/1991 | Hanawa et al. .............. 324/309 |
| 5,078,141 A | * | 1/1992 | Suzuki et al. ................ 600/422 |
| 5,229,717 A | * | 7/1993 | Hinks .......................... 324/309 |
| 5,289,126 A | | 2/1994 | Mori et al. |
| 5,315,250 A | | 5/1994 | Ehnholm et al. |
| 5,377,679 A | | 1/1995 | Machida et al. |
| 5,594,336 A | * | 1/1997 | Gullapalli et al. .......... 324/309 |
| 5,757,188 A | | 5/1998 | Miyazaki |
| 5,833,609 A | * | 11/1998 | Dannels et al. ............. 600/410 |
| 5,909,119 A | * | 6/1999 | Zhang et al. ................ 324/309 |
| 6,172,503 B1 | | 1/2001 | Mori |
| 6,483,307 B1 | * | 11/2002 | Ookawa ....................... 324/309 |
| 6,541,971 B1 | * | 4/2003 | Dannels ....................... 324/309 |
| 6,603,990 B1 | * | 8/2003 | Zhang et al. ................ 600/410 |
| 6,737,865 B1 | | 5/2004 | Asano et al. |
| 6,750,650 B1 | * | 6/2004 | Kiefer et al. ................ 324/309 |
| 6,804,546 B1 | * | 10/2004 | Thompson et al. .......... 600/410 |

OTHER PUBLICATIONS

Fritz Schick et al., "Highly Selective Water and Fat Imaging Applying Multislice Sequences without Sensitivity to B1 Field Inhomogeneities", Magnetic Resonance in Medicine, 38, pp. 269-274 (1997).
J. Forster et al., "Slice Selective Fat Saturation in MR Angiography Using Spatial-Spectral Selective Prepulses", Journal of Magnetic Resonance Imaging, 8(3), pp. 583-589 (1998).

* cited by examiner

*Primary Examiner*—Diego Gutierrez
*Assistant Examiner*—Dixomara Vargas
(74) *Attorney, Agent, or Firm*—Carl B. Horton, Esq.; Armstrong Teasdale LLP

(57) ABSTRACT

A method and apparatus for mitigating limitations on spatial selectivity and frequency selectivity in space- and frequency-selectively generating magnetic resonance signals, when applying a first pulse sequence PS1 for suppressing a frequency component of fat in a predefined slice in a region to be examined of a subject by an RF coil section and a gradient coil section, gradient magnetic field pulses a in which a positive pulse PLP and a negative pulse PLN having the same area ar1 continuously alternate and the ratio of the magnitude HT1 of the positive pulse PLP and the magnitude HT2 of the negative pulse is HT1:HT2=½ are applied by the gradient coil section, and pulses of RF waves for space and frequency selection are applied by the RF coil section simultaneously with the positive pulses PLP.

16 Claims, 4 Drawing Sheets

SYSTEMS AND METHODS FOR GENERATING A PULSE SEQUENCE FOR MITIGATING A LIMITATION ON SPATIAL SELECTIVITY

CROSS REFERENCE TO RELATED APPLICATIONS

This application claims the benefit of Japanese Application No. 2003-322918 filed Sep. 16, 2003.

BACKGROUND OF THE INVENTION

The present invention relates to a magnetic resonance imaging apparatus and a magnetic resonance image producing method for conducting imaging by generating magnetic resonance signals in which a specific frequency component is suppressed or excited from a specific section in a region to be examined of a subject.

Magnetic resonance imaging (MRI) is a technique of applying a gradient magnetic field and an RF (radio frequency) wave to a subject in a static magnetic field, and producing an image based on magnetic resonance signals emitted as an echo from protons in a region to be examined.

One known technique of magnetic resonance imaging is an SPSP (spectral-spatial) technique, for example, which collects magnetic resonance signals in which a specific frequency is suppressed, and produces an image based on the magnetic resonance signals in which the specific frequency is suppressed (see Non-Patent Documents 1 and 2, for example).

In the SPSP technique, a sequence of predefined RF waves is applied to the subject simultaneously with a gradient magnetic field that oscillates in positive and negative polarities. Thus, magnetic resonance signals in which a frequency of a desired tissue, for example, of fat, is suppressed can be obtained from a predefined section in the region to be examined of the subject.

Accuracy in selecting a desired section in a region to be examined is generally referred to as spatial selectivity. Moreover, the suppressing of the frequency of fat in magnetic resonance signals is generally referred to as fat suppression, and acquiring of magnetic resonance signals of a specific frequency band for, for example, fat suppression is generally referred to as frequency selectivity.

[Non-Patent Document 1] Fritz Schick et al., "Highly Selective Water and Fat Imaging Applying Multislice Sequences without Sensitivity to B1 Field Inhomogeneities," *Magnetic Resonance in Medicine*, 38, pp. 269–274 (1997).

[Non-Patent Document 2] J. Forster et al., "Slice-Selective Fat Saturation in MR Angiography Using Spatial-Spectral Selective Prepulses," *Journal of Magnetic Resonance Imaging*, 8(3), pp. 583–589 (1998).

In the SPSP technique, a time period in which an RF wave for determining spatial selectivity can be applied to a subject is determined by the magnitude of the static magnetic field. Therefore, if the magnitude of the static magnetic field is limited by hardware performance, for example, then the time period in which an RF wave can be applied is limited. As a result, a disadvantage that sufficient spatial selectivity cannot be achieved may sometimes arise.

Moreover, in the SPSP technique, the influence by residual magnetization caused by the gradient magnetic field that oscillates in positive and negative polarities applied to the subject leads to a disadvantage that a sufficient fat suppression effect cannot be obtained.

SUMMARY OF THE INVENTION

It is therefore an object of the present invention to provide a magnetic resonance imaging apparatus that can mitigate limitations on spatial selectivity and frequency selectivity in space- and frequency-selectively generating magnetic resonance signals.

Moreover, it is another object of the present invention to provide a magnetic resonance image producing method that can mitigate limitations on spatial selectivity and frequency selectivity in space- and frequency-selectively generating magnetic resonance signals.

A magnetic resonance imaging apparatus in accordance with the present invention comprises RF wave applying means for applying an RF wave to a region to be examined of a subject in a static magnetic field, gradient magnetic field applying means for applying a gradient magnetic field for assigning position information to said region to be examined to define a selected section, and detecting means for detecting magnetic resonance signals from protons in said selected section, for generating image data for said region to be examined based on said magnetic resonance signals detected by said detecting means, wherein said magnetic resonance imaging apparatus further comprises control means for using said RF wave applying means, said gradient magnetic field applying means, and said detecting means in combination, and causing said means to execute a first pulse sequence for suppression or excitation of target protons in said selected section, and a second pulse sequence for collecting said magnetic resonance signals in which a frequency component of a resonance frequency of said target protons is suppressed or excited from a region containing said selected section, and said control means, in said first pulse sequence, causes pulses of said gradient magnetic field having the same area and different polarities to have asymmetric magnitudes in positive and negative polarities, and causes said RF wave to be applied simultaneously with each pulse of said gradient magnetic field that has said polarity of smaller magnitude.

A magnetic resonance image producing method in accordance with the present invention employs a magnetic resonance imaging apparatus comprising RF wave applying means for applying an RF wave to a region to be examined of a subject in a static magnetic field, and gradient magnetic field applying means for applying a gradient magnetic field for assigning position information to said region to be examined to define a selected section, for generating image data for said region to be examined based on magnetic resonance signals from protons in said selected section, wherein said magnetic resonance image producing method comprises a magnetic resonance signal generating step of executing a pulse sequence for suppression or excitation of target protons in said selected section by said RF wave applying means and said gradient magnetic field applying means, to generate said magnetic resonance signals in which a frequency component of a resonance frequency of said target protons is suppressed or excited from a region containing said selected section, and said magnetic resonance signal generating step comprises applying pulses of said gradient magnetic field having the same area and different polarities and having asymmetric magnitudes in positive and negative polarities by said gradient magnetic field applying means, and applying said RF wave simultaneously with each pulse of said gradient magnetic field that has said polarity of smaller magnitude by said RF wave applying means.

In the present invention, the control means uses RF wave applying means and gradient magnetic field applying means in combination and drives them according to a predetermined pulse sequence to suppress or excite target protons in a certain selected section in a region to be examined. In such a pulse sequence, the control means causes the gradient magnetic field applying means to apply pulses of the gradient magnetic field having the same area and different polarities and having asymmetric magnitudes in positive and negative polarities, and causes the RF wave applying means to apply an RF wave simultaneously with each pulse of the gradient magnetic field that has the polarity of smaller magnitude. Thus, magnetic resonance signals in which a frequency component of a resonance frequency of target protons is suppressed or excited can be obtained from the region to be examined in the selected section.

The magnetic resonance signals from the region to be examined are detected by the detecting means.

According to the present invention, it is possible to mitigate limitations on spatial selectivity and frequency selectivity in space- and frequency-selectively generating magnetic resonance signals.

The present invention is suitably employed in a magnetic resonance imaging application employing magnetic resonance signals to conduct imaging on a subject.

Further objects and advantages of the present invention will be apparent from the following description of the preferred embodiments of the invention as illustrated in the accompanying drawings.

DETAILED DESCRIPTION OF THE INVENTION

Embodiments of the present invention will now be described with reference to the accompanying drawings.

FIRST EMBODIMENT

An exemplary configuration of an MR (magnetic resonance) imaging apparatus in accordance with a first embodiment of the present invention will be first described below.

Figure 1:
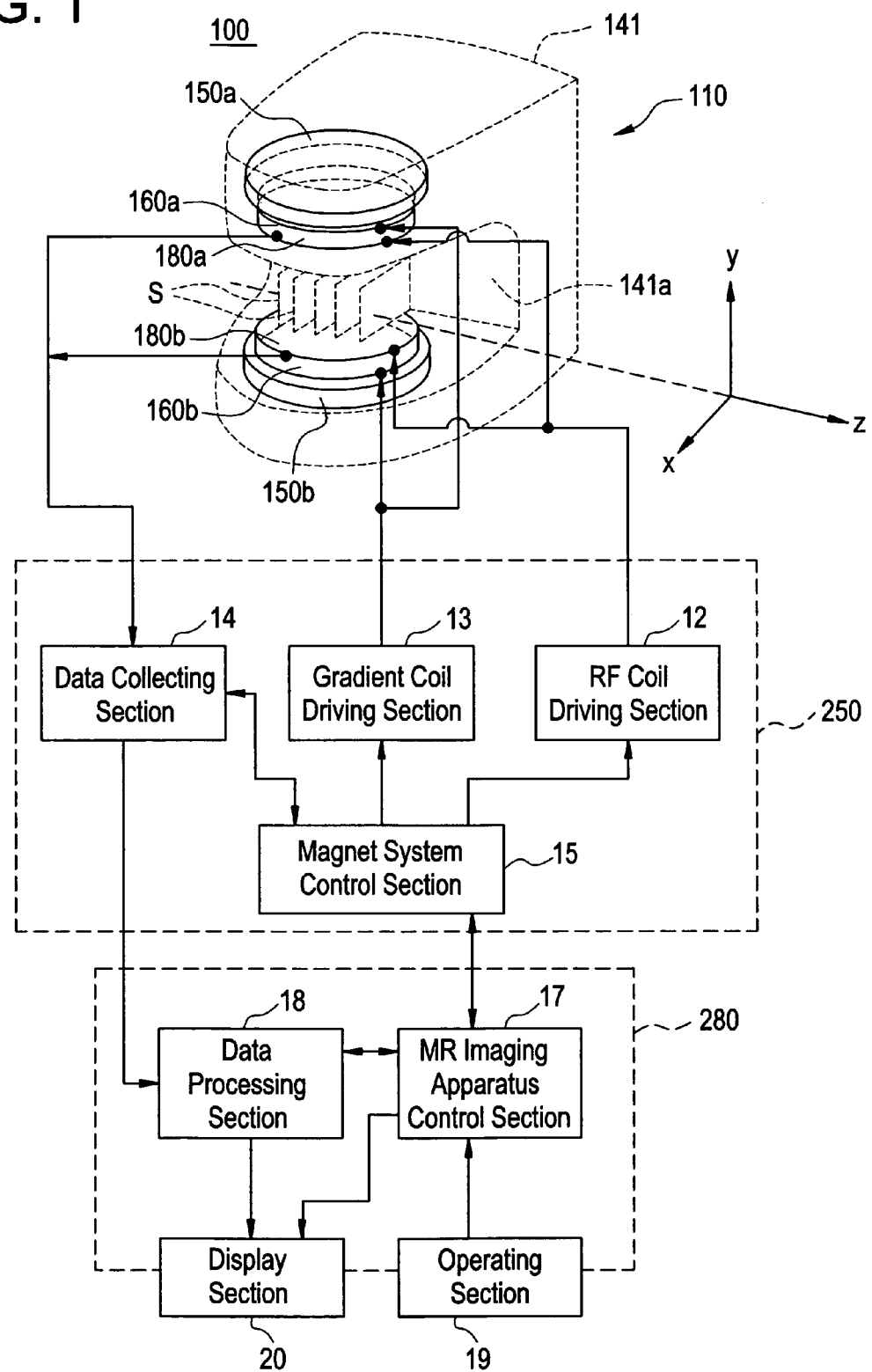
FIG. 1 is a schematic block diagram generally showing the configuration of an MR imaging apparatus in accordance with a first embodiment of the present invention.

FIG. 1 is a schematic block diagram that generally shows the configuration of an MR imaging apparatus 100 in accordance with the first embodiment.

The MR imaging apparatus 100 comprises a main body section 110 and a console section 280. In FIG. 1, the main body section 110 is illustrated in a schematic perspective phantom view of its main portion.

The main body section 110 comprises a magnet system and a driving section 250.

The magnet system includes a pair of static magnetic field generating magnet sections 150a and 150b, gradient coil sections 160a and 160b, and RF (radio frequency) coil sections 180a and 180b, each member being disposed to face its counterpart in a housing 141 of the main body section 110.

These sections are disposed with each member facing its counterpart and are arranged in order of, for example, the RF coil sections 180a and 180b, gradient coil sections 160a and 160b, and static magnetic field generating magnet sections 150a and 150b from the inside. Between the innermost RF coil sections 180a and 180b, a bore 141a is formed, in which a subject (not shown) is positioned.

Since the MR imaging apparatus 100 as shown in FIG. 1 has the housing 141 constructed in a shape such that the bore 141a is largely open, it is called an open MR imaging apparatus.

The driving section 250 comprises an RF coil driving section 12, a gradient coil driving section 13, a data collecting section 14, and a magnet system control section 15. Although these sections are illustrated as being apart from the main body section 110 to clearly show their connection relationship in FIG. 1, they are actually provided inside the housing 141 of the main body section 110, for example.

The magnet system control section 15 is connected to the RF coil driving section 12, gradient coil driving section 13, and data collecting section 14.

The RF coil driving section 12 and data collecting section 14 are connected to the RF coil sections 180a and 180b. The gradient coil driving section 13 is connected to the gradient coil sections 160a and 160b.

An embodiment of the RF wave applying means in the present invention is constituted by the RF coil sections 180a and 180b and RF coil driving section 12. An embodiment of the gradient magnetic field applying means in the present invention is constituted by the gradient coil sections 160a and 160b and gradient coil driving section 13. An embodiment of the detecting means is constituted by the RF coil sections 180a and 180b and data collecting section 14. An embodiment of the control means in the present invention corresponds to the magnet system control section 15.

The static magnetic field generating magnet sections 150a and 150b are made using a permanent magnet, for example. The static magnetic field generating magnet sections 150a and 150b disposed to face each other generate a static magnetic field in the bore 141a.

The direction of the static magnetic field generated by the static magnetic field generating magnet sections 150a and 150b is defined as a y-direction, for example. As shown in FIG. 1, since the static magnetic field generating magnet sections 150a and 150b are vertically disposed facing each other in the present embodiment, the vertical direction represents the y-direction. The static magnetic field in the vertical direction is sometimes referred to as a vertical magnetic field.

Moreover, the two directions orthogonal to the y-direction are defined as x- and z-directions, as shown in FIG. 1. Although not shown, in many cases, the subject is positioned in the bore 141a so that the subject's body axis direction from head to toe coincides with the z-direction.

In current open MR imaging apparatuses, the magnetic field intensity of the static magnetic field is of the order of 0.2–0.7 Teslas (T). A magnet system of about 0.2–0.7 Teslas is generally referred to as a mid-to-low magnetic field system.

The gradient coil sections 160a and 160b have three pairs of gradient coils for assigning three-dimensional position information to magnetic resonance signals detected by the RF coil sections 180a and 180b. The gradient coil sections 160a and 160b use these gradient coils to generate gradient magnetic fields for imparting gradients in three directions, i.e., x-, y- and z-directions, to the intensity of the static magnetic field generated by the static magnetic field generating magnet sections 150*a* and 150*b*.

The gradient magnetic fields in the three directions comprise a slice selective gradient magnetic field for selecting a slice in a region to be examined, a phase encoding gradient magnetic field, and a readout gradient magnetic field (also referred to as a frequency encoding gradient magnetic field).

The RF coil sections 180*a* and 180*b* include transmission and reception RF coils. The transmission RF coil applies a magnetic field in an RF band to the region to be examined of the subject lying in the static magnetic field for inclining an axis of spin rotation of protons in the region to be examined. The magnetic field in an RF band will be referred to simply as an RF wave hereinbelow.

Upon termination of the application of the RF wave by the transmission RF coil, magnetic resonance signals having a frequency component of the same resonance frequency as the applied RF wave's frequency band are re-emitted from the region to be examined owing to spins in the region to be examined. The reception RF coil detects the magnetic resonance signals from the region to be examined.

The transmission and reception RF coils may be the same coil, or may be separate dedicated coils with, for example, the RF coil in the RF coil section 180*a* used as a transmission coil and the RF coil in the RF coil section 180*b* as a reception RF coil.

Moreover, besides the RF coil sections 180*a* and 180*b* that are contained in the housing 141, a dedicated RF coil adapted for a region to be examined of the subject, such as the head, abdomen or shoulder, may be employed as the transmission/reception RF coil.

The frequency range of the RF wave is 2.13 MHz–85 MHz, for example.

The gradient coil driving section 13 transmits a gradient magnetic field excitation signal for generating gradient magnetic fields for imparting three-dimensional gradients to the intensity of the static magnetic field to the aforementioned three gradient coils.

In response to the gradient magnetic field excitation signal from the gradient coil driving section 13, the gradient coil sections 160*a* and 160*b* are driven to generate three-dimensional gradients in the intensity of the static magnetic field, whereby a region to be imaged in the subject is defined. The imaged region is defined by a unitary cross-sectional slice having a certain thickness. FIG. 1 shows a plurality of exemplary slices S that are parallel to the x-y plane, arranged in the z-direction. However, the arrangement shown in FIG. 1 is merely an example, and the slices may be defined in an arbitrary position in the bore 141*a*.

The RF coil driving section 12 supplies an RF wave excitation signal to the RF coil sections 180*a* and 180*b* to apply an RF wave to the subject in the bore 141*a*. The application of the RF wave changes the inclination of the axis of spin rotation of the protons in the region to be examined.

The data collecting section 14 takes in magnetic resonance signals detected by the RF coil sections 180*a* and 180*b*, and collects them as original data for magnetic resonance image production.

After the data collecting section 14 has collected all of data for producing an image, for example, it sends the collected data to a data processing section 18 in a console section 280, which will be discussed later.

The data collecting section 14 also sends part of the data of the taken-in magnetic resonance signal to a magnet system control section 15.

In response to an instruction signal from an MR imaging apparatus control section 17 in the console section 280, the magnet system control section 15 controls the RF coil driving section 12, gradient coil driving section 13 and data collecting section 14 so that the RF waves, gradient magnetic fields and magnetic resonance signals conform to a predetermined pulse sequence.

The pulse sequence defines the pulse waveforms (referred to simply as pulses hereinbelow) of the RF waves, gradient magnetic fields and magnetic resonance signals along a time period, and the RF wave excitation signal and gradient magnetic field excitation signal in the form of pulses according to the definition by the pulse sequence are input from the RF coil driving section 12 and gradient coil driving section 13 to the RF coil sections 180*a* and 180*b* and gradient coil sections 160*a* and 160*b*, respectively.

The console section 280 is provided for several kinds of operations for acquiring a magnetic resonance image of the subject by the main body section 110, including inputting of command parameters to the magnet system control section 15 and inputting of an imaging initialization command.

As shown in FIG. 1, the console section 280 comprises an MR imaging apparatus control section 17, a data processing section 18, an operating section 19, and a display section 20.

The MR imaging apparatus control section 17 is connected to the data processing section 18 and display section 20. The data processing section 18 is connected to the display section 20.

Moreover, the data processing section 18 is connected with the data collecting section 14, and the MR apparatus control section 17 is connected with the operating section 19.

The operating section 19 is implemented by an input device, such as keyboard and mouse. A signal of a command from an operator operating the console section 280 is input to the MR apparatus control section 17 via the operating section 19.

The MR imaging apparatus control section 17 is implemented by, for example, hardware for calculation, such as CPU, and software for driving the hardware, such as programs.

The programs are stored in a storage section (not shown) implemented by a RAM (random access memory) and a hard disk drive, for example.

The MR imaging apparatus control section 17 integrally controls the magnet system control section 15, data processing section 18, and display section 20 to realize a command from the operator input via the operating section 19. If limitations such as hardware limitation by the main body section 110 are encountered, the MR apparatus control section 17 displays on a display section 20 a message indicating that the input command cannot be executed.

The data processing section 18 executes processing for producing a magnetic resonance image by applying pre-specified processing including calculation and image processing on the magnetic resonance signal data sent from the data collecting section 14, based on a command from the operator input via the operating section 19 and MR apparatus control section 17. The image produced by the data processing section 18 can be stored in a storage section (not shown).

The image produced by the data processing section 18 is appropriately displayed on the display section 20 in response to a request from the operator.

The display section 20 is implemented by a monitor such as a liquid crystal display panel or a CRT (cathode-ray tube).

The display section 20 also displays an operation image for operating the MR imaging apparatus 100.

The MR imaging apparatus 100 having the aforementioned configuration can be used to produce a magnetic resonance image of the subject. Now an exemplary pulse sequence for generating magnetic resonance signals for use in producing a magnetic resonance image will be described with reference to FIG. 2.

Figure 2:
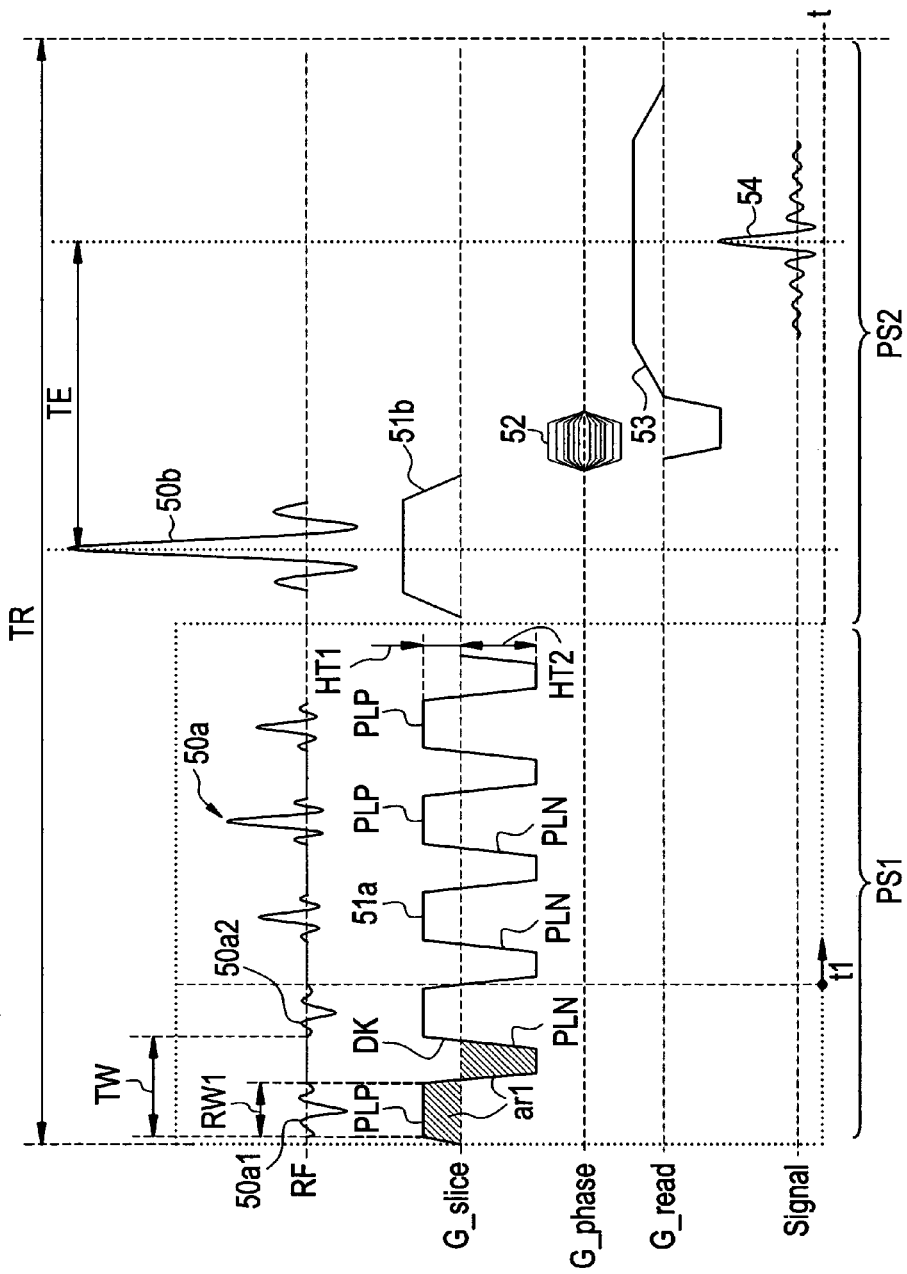
FIG. 2 is a diagram showing an exemplary pulse sequence for use in generating a magnetic resonance signal in the first embodiment of the present invention.

In the pulse sequence shown in FIG. 2, the horizontal axis represents a time period t proceeding from left to right. The illustrated curves designate, in sequence from the top of FIG. 2, an RF wave applying pulse sequence RF, a slice selective gradient magnetic field applying pulse sequence G_slice, a phase encoding gradient magnetic field applying pulse sequence G_phase, a readout gradient magnetic field applying pulse sequence G_read, and a magnetic resonance signal generating sequence Signal.

The sequence RF represents the waveform of RF waves applied by the RF coil sections 180a and 180b to the subject.

The sequence G_slice represents the waveform of slice selective gradient magnetic field pulses applied by the gradient coil sections 160a and 160b to the region to be examined for selecting an imaged slice in the region to be examined.

The sequence G_phase represents the waveform of phase encoding gradient magnetic field pulses applied by the gradient coil sections 160a and 160b to the region to be examined for use in encoding position information in the phase direction of the subject.

The sequence G_read represents the waveform of readout gradient magnetic field pulses applied by the gradient coil sections 160a and 160b to the region to be examined for emitting magnetic resonance signals from the region to be examined to which an RF wave is applied by the RF coil sections 180a and 180b.

The sequence Signal represents a magnetic resonance signal 54 emitted from the region to be examined and detected by the RF coil sections 180a and 180b.

The step of applying an RF wave and applying phase encoding by the phase encoding gradient magnetic field is repeated while varying the magnitude of the phase encoding gradient magnetic field a number of times predetermined depending upon the pixel size of a target image. This process is expressed by a plurality of phase encoding gradient magnetic field pulses 52 in the sequence G_phase in FIG. 2.

The pulse sequence for generating a magnetic resonance signal in accordance with the first embodiment is roughly divided into a first pulse sequence PS1 and a second pulse sequence PS2, as shown in FIG. 2.

The first pulse sequence PS1 is a pulse sequence that suppresses or excites a certain frequency only in a prespecified one of a plurality of slices S defined in the subject in the static magnetic field.

For the pulse sequence capable of space- and frequency-selectively generating magnetic resonance signals in this manner, a pulse sequence according to an SPSP (spectral-spatial) technique can be employed, for example.

The SPSP technique is described in the aforementioned non-Patent Documents 1 and 2, for example, and detailed description thereof will be omitted here; in the technique, as shown by the RF waves 50a and slice selective gradient magnetic field pulses 51a in FIG. 2, RF waves having a predefined waveform are applied while sequentially applying slice selective gradient magnetic field pulses having alternating positive and negative polarities to select a region in which target protons are to be suppressed or excited.

In the following description, an example is addressed in which fat is selected as the target protons, and the first pulse sequence PS1 suppresses a frequency component of a resonance frequency band of fat in the magnetic resonance signal 54. In the SPSP technique, however, the waveforms of the RF waves 50a and slice selective gradient magnetic field pulses 51a can be appropriately modified to excite a frequency component of a resonance frequency band of fat. Since the pulse sequence according to the SPSP technique is frequency-selective, it can suppress or excite a frequency component of a resonance frequency band not only of fat but also of water, for example.

In such a technique as the SPSP technique that employs a space- and frequency-selective pulse sequence, a cycle time TW in which an RF wave 50a for determining spatial selectivity may be applied is largely determined by the magnitude of the static magnetic field. For example, if the magnitude of the static magnetic field is 0.35 Teslas (T), the cycle time TW is about 6–8 ms.

To improve spatial selectivity by reducing the thickness of the slice S, larger slice selective gradient magnetic field pulses 51a must be applied. But the upward transition time period and downward transition time period, or slope DK, of the slice selective gradient magnetic field pulses 51a are limited by hardware performance of the MR imaging apparatus 100. Thus, an attempt to augment the slice selective gradient magnetic field pulses 51a reduces the length RW1 of a flat portion in a slice selective gradient magnetic field pulse 51a over which an actual pulse of an RF wave 50a can be applied.

In the present embodiment, to increase the length WF as much as possible, the slice selective gradient magnetic field pulses 51a applied in the first pulse sequence are configured to have the same area and asymmetric magnitudes in positive and negative polarities.

More specifically, the area of a positive pulse PLP and that of a negative pulse PLN in the slice selective gradient magnetic field pulses 51a are equal. In the present embodiment, the area of each pulse PLP and PLN is designated as ar1.

Moreover, the magnitude of polarity HT1 of the positive pulse PLP and the magnitude of polarity HT2 of the negative pulse PLN are different, and they are asymmetric with respect to an axis of zero magnitude.

In the present embodiment, for example, the magnitude HT2 of the negative pulse PLN is larger than the magnitude HT1 of the positive pulse PLP. Accordingly, if the slope DK is constant, the length of the flat portion in the positive pulse PLP is longer than that in the negative pulse PLN.

In the present embodiment, to apply each of the RF waves 50a as long as possible, the pulses thereof are applied simultaneously with the positive pulses PLP having polarity of smaller magnitude, hence, of longer flat portion.

It is known that if a permanent magnet is employed as the static magnetic field generating magnet sections 150a and 150b, hysteresis generated by residual magnetization is present. Since the residual magnetization changes the magnetic field intensity of the static magnetic field and affects the magnetic resonance signals, there arises a possibility of adverse effects, including that a sufficient fat suppression effect cannot be obtained, and that the magnetic resonance signal 54 obtained by the second pulse sequence PS2 is different from the desired signal.

In the present embodiment, since the magnitude HT1 of the positive pulse PLP and the magnitude HT2 of the negative pulse PLN are different, the influence by residual magnetization can be reduced. This will now be described in detail.

Figure 4:
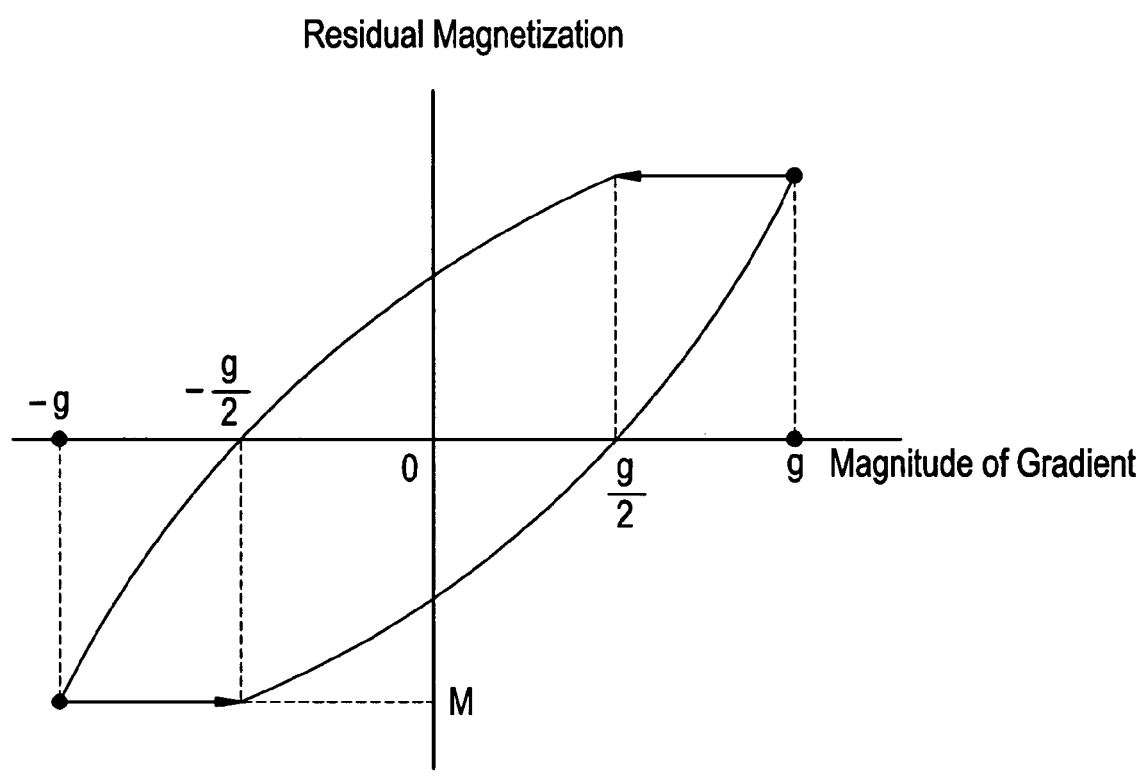
FIG. 4 is a diagram showing hysteresis of residual magnetization.

FIG. 4 is a diagram for explaining hysteresis by residual magnetization. The horizontal axis of FIG. 4 represents the magnitude of the slice selective gradient magnetic field pulses 51*a*, i.e., the magnitude of the gradient, and the vertical axis represents residual magnetization.

It is known that, as shown in FIG. 4, residual magnetization generated in the static magnetic field generating magnets 150*a* and 150*b* employing a permanent magnet has hysteresis by which the magnitude of residual magnetization varies depending upon a path of variation of the magnitude of the gradient. Consider a variation of the magnitude of the gradient forming a loop from g to −g as shown in FIG. 4. The magnitude of the gradient is assumed to vary, for example, from the point of −g/2 in the direction of arrows in the drawing. At the point of the gradient having a magnitude of −g/2, residual magnetization is zero.

After the magnitude of the gradient has been increased in a negative direction up to −g along the loop and then returned to −g/2 again, residual magnetization is not zero but −M. To eliminate the residual magnetization, the magnitude of the gradient must be increased to g/2.

In other words, in the loop along which the magnitude of the gradient continuously varies from g to −g, in order to bring the residual magnetization from a point where it once became zero back to zero, the magnitude of the gradient must be continuously changed from −g to g/2, or g to −g/2.

As pointed out above, it is known that residual magnetization is eliminated by sequentially applying gradient magnetic fields having opposite polarities with absolute magnitudes of 2:1. This property is true of almost all magnet systems employing a permanent magnet regardless of the magnitude of the static magnetic field generated.

Accordingly, in the present embodiment, to reduce the influence by residual magnetization, the ratio between the magnitude HT1 of the positive pulse and the magnitude HT2 of the negative pulse is set as HT1:HT2=1:2, as shown in FIG. 2.

If residual magnetization at the start point of the first pulse sequence PS1 is zero, the influence by residual magnetization can be eliminated at a time point t1 shown in FIG. 2 in the beginning of the cycles of pulse application for the RF waves 50*a*.

It should be noted that the magnitudes HT1 and HT2 are not limited to having the ratio HT1:HT2=1:2, and the influence by residual magnetization can be reduced to some degree provided only that the magnitudes HT1 and HT2 are different.

In a second pulse sequence PS2 after the execution of the first pulse sequence PS1, a pulse sequence according to a spin echo technique, a gradient echo technique or an echo planar imaging, for example, can be appropriately applied.

An exemplary pulse sequence for acquiring a magnetic resonance signal from the subject according to the gradient echo technique is shown in FIG. 2.

In the gradient echo technique, as shown in FIG. 2, an RF wave 50*b* is applied to the subject while applying a slice selective gradient magnetic field pulse 51*b* to select a slice. The slice selected is that whose fat is suppressed in the first pulse sequence PS1.

After applying the RF wave 50*b* for generating the magnetic resonance signal 54, a phase encoding gradient magnetic field pulse 52 is applied to effect encoding for assigning position information in the phase encoding direction as shown in FIG. 2, and at the same time, a readout gradient magnetic field pulse 53 is applied to the region to be examined. By applying the readout gradient magnetic field pulse 53, a magnetic resonance signal 54 is detected by the RF coil sections 180*a* and 180*b* as an echo from the slice selected by the slice selective gradient magnetic field pulse 51*b*.

The time period from the center of the RF wave 50*b* applied for acquiring the magnetic resonance signal 54 to the center of the magnetic resonance signal 54 is generally referred to as an echo time TE.

The time period from the beginning of the first pulse sequence PS1 to the end of the second pulse sequence PS2 is generally referred to as a repetition period TR.

As described above, in the present embodiment, the slice selective gradient magnetic field pulses 51*a* are applied to suppress or excite a resonance frequency of protons in a specific tissue (e.g., fat) in a specific slice in a region to be examined. In the present embodiment, the slice selective gradient magnetic field pulses 51*a* have the same area in positive and negative polarities, where the magnitude HT1 of the positive pulse PLP is smaller than the magnitude HT2 of the negative pulse PLN, resulting in asymmetric magnitudes with respect to an axis of zero magnitude. Thus, the positive pulse PLP of polarity of smaller magnitude has the length RW1 of its flat portion larger than that of the negative pulse PLN. Therefore, even if the cycle time TW in which RF waves 50*a* can be applied is limited by hardware limitation and the like, a longer RF wave 50*a* can be applied by applying the pulse thereof simultaneously with the positive pulse PLP. Since the time period for applying the RF wave 50*a* is directly related to spatial selectivity by the first pulse sequence PS1, the present embodiment can select a desired slice more accurately.

Moreover, according to the present embodiment, the influence by residual magnetization is eliminated by setting HT1:HT2=1:2. As a result, a variation in the magnetic field intensity of the static magnetic field due to residual magnetization is prevented to obtain a more reliable frequency selection effect, thus improving image quality of a magnetic resonance image.

Furthermore, the influence by residual magnetization can be reduced to some degree even if the magnitudes HT1 and HT2 of the positive and negative pulses do not necessarily have a ratio 1:2, and the length RW1 of the flat portion can be changed according to the magnitudes HT1 and HT2; therefore, the waveforms in the pulse sequence can be appropriately modified, thus improving the degree of freedom in designing a pulse sequence.

The cycle time TW in which an RF wave 50*a* can be applied is directly related to the magnitude of the static magnetic field, and a smaller magnetic field intensity of the static magnetic field gives a shorter cycle time TW. Since the application time for a pulse of an RF wave 50*a* can be lengthened within a limited cycle time TW in the present embodiment, it can be considered especially effective in a mid-to-low magnetic field magnet system.

Since a permanent magnet is generally employed in the mid-to-low magnetic field magnet system, the present embodiment can be considered especially effective for a magnet system employing a permanent magnet.

SECOND EMBODIMENT

By modifying the waveform of the slice selective gradient magnetic field pulses 51*a*, the influence by residual magnetization can be eliminated at an earlier time point. Slice selective gradient magnetic field pulses therefor will be described hereinbelow.

Figure 3:
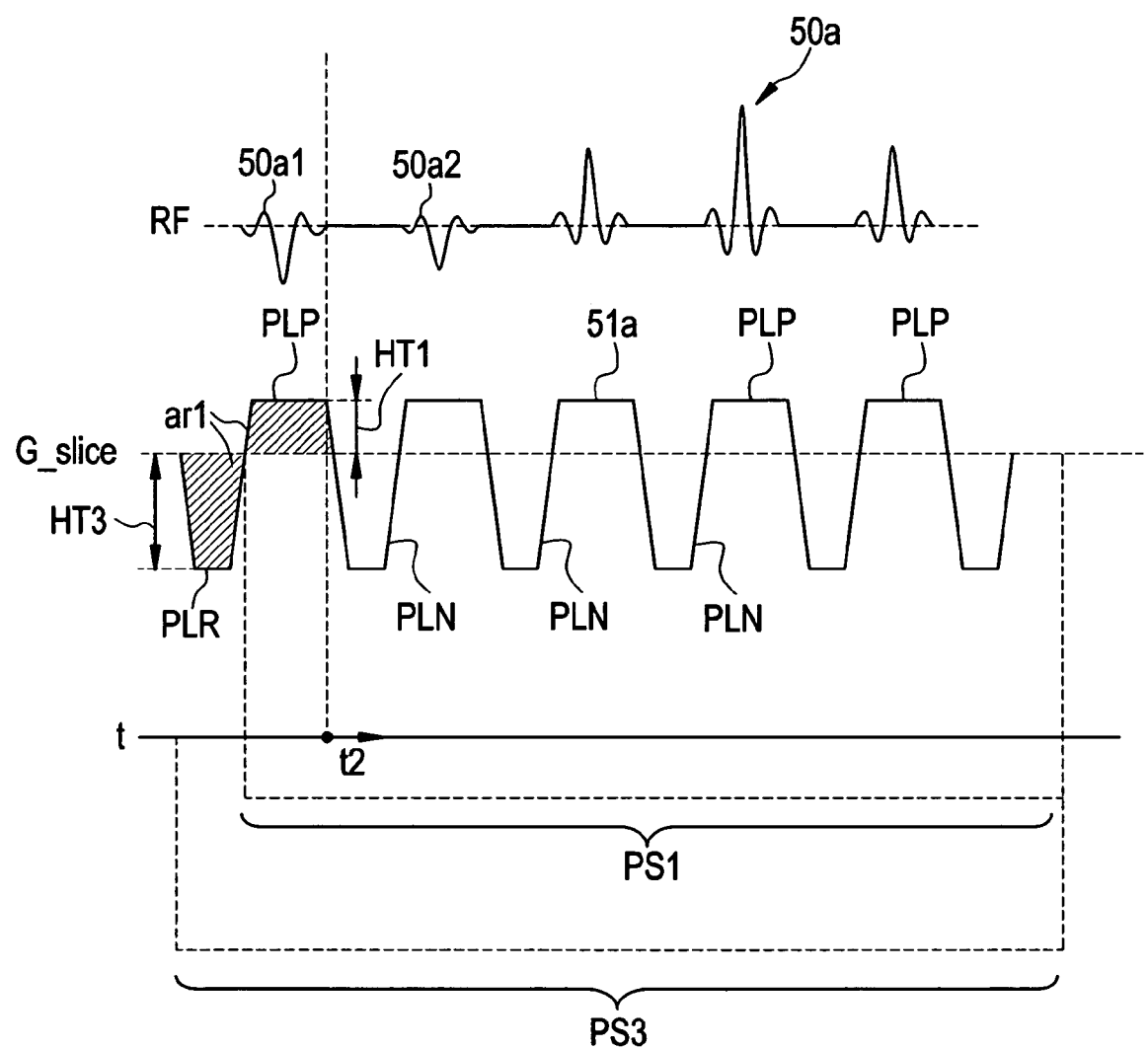
FIG. 3 is a diagram showing a main portion of an exemplary pulse sequence for use in generating a magnetic resonance signal in a second embodiment of the present invention.

FIG. 3 is a diagram showing a pulse sequence PS3 used instead of the first pulse sequence PS1 in a second embodiment.

The second embodiment is similar to the first embodiment except that the pulse sequence PS3 is used instead of the first pulse sequence PS1, and detailed description on similar portions will be omitted.

The pulse sequence PS3 has a pulse PLR of the slice selective gradient magnetic field appended before the first pulse sequence PS1 of the first embodiment, and the pulse PLR has the same area and a different polarity as compared with the first one of the slice selective gradient magnetic field pulses 51a in the first pulse sequence PS1.

It should be noted that in FIG. 3, only charts of the sequences RF and G_slice and the axis of the time period t are shown. Similarly to the first embodiment, the time t proceeds from left to right.

As an example in the present embodiment, a negative pulse PLR is placed before and abutting the positive slice selective gradient magnetic field pulse PLP. The area of the pulse PLR is the same as the area ar1 of each of the slice selective gradient magnetic field pulses 51a.

The ratio of the magnitude HT3 of the negative pulse PLR and the magnitude HT1 of the positive pulse PLP is set as HT1:HT3=1:2, as in the first embodiment, and thus, the influence by residual magnetization can be eliminated in the beginning at the time point t2 shown in FIG. 3.

Comparing the first pulse sequence PS1 with the pulse sequence PS3 of the second embodiment, the time at which application of two pulses 50a1 and 50a2 of the RF waves 50a ends is a time t1 in the first pulse sequence PS1. On the other hand, the time at which only the pulse 50a1 ends is a time t2 at which the influence by residual magnetization can be eliminated in the pulse sequence PS3.

Thus, the second embodiment offers an effect that the influence by residual magnetization can be eliminated earlier, in addition to the same effects as those in the first embodiment.

It should be noted that the present invention is not limited to the aforementioned embodiments but may be appropriately modified within the scope of the appended claims.

For example, the present invention can be applied to an MR imaging apparatus comprising a "cylindrical" magnet system having a cylindrically formed bore, as well as to the MR imaging apparatus comprising the open magnet system as shown in FIG. 1. Moreover, the static magnetic field is not limited to that generated by the permanent magnet but may be generated by employing a normal- or super-conductive magnet.

Furthermore, while the aforementioned embodiments address a case in which a sequence according to the gradient echo technique is taken as the second pulse sequence PS2, other magnetic resonance signal collecting sequences including that of the spin echo technique and the like can be employed in the present invention. As the first pulse sequence PS1, any pulse sequence, other than that of the SPSP technique, which can space- and frequency-selectively generate magnetic resonance signals, can be applied.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising an RF wave applying device for applying an RF wave to a region to be examined of a subject in a static magnetic field, a gradient magnetic field applying device for applying a gradient magnetic field for assigning position information to said region to be examined to define a selected section, and a detecting device for detecting magnetic resonance signals from protons in said selected section, for generating image data for said region to be examined based on said magnetic resonance signals detected by said detecting device, wherein said magnetic resonance imaging apparatus further comprises a control device for:

using said RF wave applying device, said gradient magnetic field applying device, and said detecting device in combination, and causing said RF wave applying device and said gradient magnetic field applying device to execute a first pulse sequence for suppression or excitation of target protons in said selected section, and a second pulse sequence for collecting said magnetic resonance signals in which a frequency component of a resonance frequency of said target protons is suppressed or excited from a region containing said selected section, and said control device, in said first pulse sequence, configured to instruct to apply a first pulse of the gradient magnetic field and a second pulse of the gradient magnetic field, wherein the first pulse has the same area as the second pulse, wherein the first pulse has a first magnitude in a positive polarity and the second pulse has a second magnitude in a negative polarity, and wherein the second magnitude is different than the first magnitude, and causes said RF wave to be applied simultaneously with each pulse of said gradient magnetic field that has polarity of smaller magnitude from the first and second magnitudes.

2. The magnetic resonance imaging apparatus of claim 1, wherein the first and second magnitudes cancel an influence by residual magnetization caused by said gradient magnetic field pulses.

3. The magnetic resonance imaging apparatus of claim 2, wherein:

a ratio of the first and second magnitudes is 1:2.

4. The magnetic resonance imaging apparatus of claim 3, wherein:

said static magnetic field is generated by a permanent magnet.

5. The magnetic resonance imaging apparatus of claim 1, wherein:

said control device applies, before said first pulse sequence, a third gradient magnetic field pulse having the same area and different polarity as compared with the first gradient magnetic field pulse in said first pulse sequence.

6. The magnetic resonance imaging apparatus of claim 1, wherein:

said static magnetic field is a mid-to-low magnetic field of a magnetic field intensity of 0.2–0.7 Teslas.

7. The magnetic resonance imaging apparatus of claim 1, wherein:

said first pulse sequence is one for suppression or excitation of a resonance frequency of fat protons.

8. The magnetic resonance imaging apparatus of claim 1, wherein:

said first pulse sequence is one for suppression or excitation of a resonance frequency of water protons.

9. A magnetic resonance image producing method employing a magnetic resonance imaging apparatus comprising an RF wave applying device for applying an RF wave to a region to be examined of a subject in a static magnetic field, and a gradient magnetic field applying device for applying a gradient magnetic field for assigning position information to said region to be examined to define a selected section, for generating image data for said region to be examined based on magnetic resonance signals from protons in said selected section, wherein said magnetic resonance image producing method comprises a magnetic resonance signal generating step of executing a pulse sequence for suppression or excitation of target protons in said selected section by said RF wave applying device and said gradient magnetic field applying device, to generate said magnetic resonance signals in which a frequency component of a resonance frequency of said target protons is suppressed or excited from a region containing said selected section, and said magnetic resonance signal generating step comprises applying a first pulse of the gradient magnetic field and a second pulse of the gradient magnetic field, wherein the first pulse has the same area as the second pulse, wherein the first pulse has a first magnitude in a positive polarity and the second pulse has a second magnitude in a negative polarity, and wherein the second magnitude is different than the first magnitude, and applying said RF wave simultaneously with each pulse of said gradient magnetic field that has polarity of smaller magnitude from the first and second magnitudes.

10. The magnetic resonance image producing method of claim 9, wherein: the first and second magnitudes cancel an influence by residual magnetization caused by said gradient magnetic field pulses.

11. The magnetic resonance image producing method of claim 10, wherein:

a ratio of the first and second magnitudes is 1:2.

12. The magnetic resonance image producing method of claim 11, wherein:

said static magnetic field is generated by a permanent magnet.

13. The magnetic resonance image producing method of claim 9, wherein:

a third gradient magnetic field pulse having the same area and different polarity as compared with the first gradient magnetic field pulse in said pulse sequence is applied before said pulse sequence.

14. The magnetic resonance image producing method of claim 9, wherein:

said static magnetic field is a mid-to-low magnetic field of a magnetic field intensity of 0.2–0.7 Teslas.

15. The magnetic resonance image producing method of claim 9, wherein:

said pulse sequence is one for suppression or excitation of a resonance frequency of fat protons.

16. The magnetic resonance image producing method of claim 9, wherein:

said pulse sequence is one for suppression or excitation of a resonance frequency of water protons.

* * * * *

UNITED STATES PATENT AND TRADEMARK OFFICE
CERTIFICATE OF CORRECTION

| | | |
|---|---|---|
| PATENT NO. | : 7,148,686 B2 | Page 1 of 1 |
| APPLICATION NO. | : 10/926696 | |
| DATED | : December 12, 2006 | |
| INVENTOR(S) | : Asano | |

It is certified that error appears in the above-identified patent and that said Letters Patent is hereby corrected as shown below:

In Claim 9, column 13, line 34, between "has" and "polarity, insert -- a --.

Signed and Sealed this

Twenty-ninth Day of April, 2008

JON W. DUDAS
*Director of the United States Patent and Trademark Office*